US007306967B1

(12) United States Patent
Kozhukh

(10) Patent No.: US 7,306,967 B1
(45) Date of Patent: Dec. 11, 2007

(54) METHOD OF FORMING HIGH TEMPERATURE THERMISTORS

(75) Inventor: Michael Kozhukh, Palo Alto, CA (US)

(73) Assignee: AdSem, Inc., Palo Alto, CA (US)

( * ) Notice: Subject to any disclaimer, the term of this patent is extended or adjusted under 35 U.S.C. 154(b) by 253 days.

(21) Appl. No.: 10/846,055

(22) Filed: May 15, 2004

Related U.S. Application Data

(60) Provisional application No. 60/473,753, filed on May 28, 2003.

(51) Int. Cl.
*H01L 21/00* (2006.01)

(52) U.S. Cl. ................. 438/54; 257/467; 257/E21.004; 257/E21.351; 338/22 R

(58) Field of Classification Search .............. 338/22 R; 257/467; 117/928; 438/54
See application file for complete search history.

(56) References Cited

U.S. PATENT DOCUMENTS 3,374,404 A * 3/1968 Luecke ........................ 257/656
3,568,125 A 3/1971 Villemant et al.
3,629,585 A 12/1971 Desvignes et al.
3,881,181 A 4/1975 Khajezadeh
4,009,482 A 2/1977 Nakata
4,035,757 A 7/1977 Einthoven et al.
4,047,436 A 9/1977 Bernard et al.
4,063,210 A 12/1977 Collver
4,276,535 A * 6/1981 Mitsuyu et al. ........... 338/22 R
4,359,372 A 11/1982 Nagai et al.
4,586,829 A 5/1986 Hübner et al.
4,772,866 A 9/1988 Willens
5,037,766 A * 8/1991 Wang ......................... 438/161
5,141,334 A 8/1992 Castles
5,172,211 A * 12/1992 Godinho et al. ............ 257/536
5,183,530 A * 2/1993 Yamazaki .................... 438/54
5,446,437 A 8/1995 Bantien et al.
5,924,996 A 7/1999 Cho et al.
6,023,978 A 2/2000 Dauenhauer et al.
6,077,228 A 6/2000 Schonberger
6,122,704 A 9/2000 Hass
6,316,770 B1 11/2001 Ouvrier-Buffet
6,319,429 B1 11/2001 Moos et al.
6,354,736 B1 3/2002 Cole et al.
6,380,840 B1 4/2002 Wienand et al.
6,433,666 B1 8/2002 Inoue et al.
6,744,346 B1 6/2004 Akram et al.
2002/0179992 A1 12/2002 Parson

OTHER PUBLICATIONS

Stanley Wolf and R. N. Tauber, Silicon Processing for the VLSI Era vol. 1, Second Edition, copyright 2000, Lattice Press pp. 5-28.*

(Continued)

*Primary Examiner*—Jerome Jackson
*Assistant Examiner*—Paul Budd
(74) *Attorney, Agent, or Firm*—Blakely, Sokoloff, Taylor & Zafman, LLP

(57) ABSTRACT

A method of manufacturing high temperature thermistors from an ingot. The high temperature thermistors can be comprised of germanium or silicon. The high temperature thermistors have at least one ohmic contact.

13 Claims, 3 Drawing Sheets

OTHER PUBLICATIONS

Stanley Wolf and R. N. Tauber, Silicon Processing for the VLSI Era vol. 1, Second Edition, copyright 2000, Lattice Press, pp. 842-845.*

U.S. Appl. No. 11/014,408, Office Action dated May 2, 2006, 7 pages.

U.S. Appl. No. 11/014,408, Office Action dated Oct. 18, 2005, 6 pages.

U.S. Appl. No. 11/014,408, Office Action dated Aug. 15, 2006, 12 pages.

U.S. Appl. No. 11/014,408, Notice of Allowance dated Jun. 8, 2007, 6 pages.

U.S. Appl. No. 11/014,408, Notice of Allowance dated Jan. 23, 2007, 5 pages.

* cited by examiner

METHOD OF FORMING HIGH TEMPERATURE THERMISTORS

RELATED APPLICATIONS

This is a U.S. patent application that claims priority under the provisional U.S. patent application Ser. No. 60/473,753, filed on May 28, 2003.

BACKGROUND OF THE INVENTION

1. Field of the Invention

This invention relates to the art of semiconductor device manufacturing, and more specifically, to the production of negative temperature coefficient (NTC) and positive temperature coefficient (PTC) semiconductor thermoresistors based upon Si and/or Ge for a temperature range of between −50° C. to +500° C.

2. Discussion of the Background Art

Semiconductor NTC thermistors for high temperature measurements are based upon ceramic materials and produced from of a mix of metal oxides such as Mn, Fe, Co, Ni, and Zn. Such thermistors are the main type of high temperature thermistors employed in the industry, and have been for many years. The electroconductivity of these thermistors strongly depends on their composition, doping impurities, condition of high temperature annealing and pressure. This makes electrical performance of these devices (resistivity value and temperature dependence of resistivity) difficult to reproduce with a high accuracy. As a result, ceramic thermistors are not interchangeable, and for high accuracy temperature measurements it is necessary to calibrate them for different temperature ranges. This significantly increases the cost of production. In addition, in ceramic thermistors a resistivity change with temperature is not very steep. As a result, the sensitivity of these thermistors is not very high. Their maximum working temperature range does not exceed 350° C. Thus, low performance, lack of a wide working temperature range, poor interchangeability and high production costs are disadvantages of high temperature ceramic NTC thermistors.

SUMMARY OF THE INVENTION

To address the shortcomings of the available art, the present invention provides a method of manufacturing high temperature thermistors comprising cutting a portion of an ingot that is substantially free from impurities, cutting a wafer from the piece of the ingot that is substantially free from the impurities, forming at least one ohmic contact, and dicing the wafer.

BRIEF DESCRIPTION OF DRAWINGS

The aforementioned advantages of the present invention as well as additional advantages thereof will be more clearly understood hereinafter as a result of a detailed description of a preferred embodiment of the invention when taken in conjunction with the following drawings, in which.

DETAILED DESCRIPTION

Figure 1:
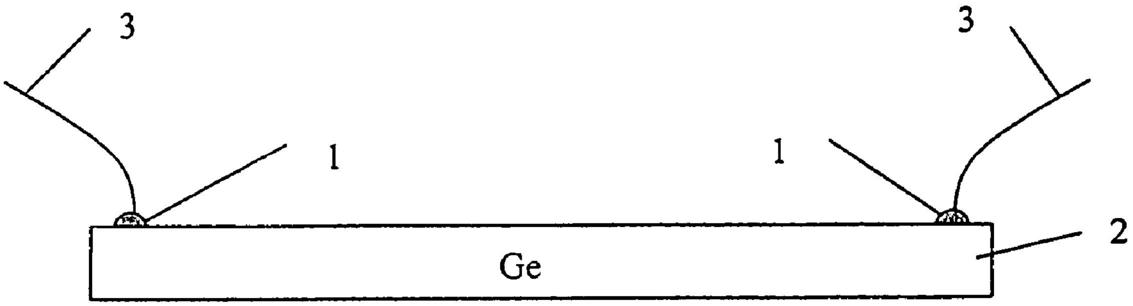
FIG. 1 shows a side view of a Ge thermistor.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

The prior art disadvantages can be eliminated in high temperature thermistors produced from crystalline Si and Ge with intrinsic conductivity. For such thermistors, their resistivity change with temperature is defined mainly by a change of the concentration of free charge carriers, which for semiconductors with intrinsic conductivity depends on the activation energy of electrons from the valence band into the conductivity band. The activation energy in semiconductors with intrinsic conductivity is equal to half of the band gap, and is about 0.53 eV for Si and 0.34 eV for Ge, which are the same (or very close to) the energy of deep levels created by grain boundaries in polycrystalline silicon and germanium. High activation energy values define the higher thermosensitivity of Si and Ge thermistors with intrinsic conductivity as compared to the thermosensitivity of ceramic thermistors. It also permits a working temperature range of up to +500° C. Because the conductivity of intrinsic semiconductors is defined by fundamental properties of the semiconductor materials (Si and Ge) such as their band gap and an intrinsic concentration of free charge carriers, all thermistors made of materials with intrinsic conductivity have the same temperature dependence (activation energy) of resistivity. Therefore, they are interchangeable in a whole working temperature range (when their size is the same).

An employment of Si and Ge, both widely used in the microelectronic industry, allows the application of advanced microelectronic technology for the manufacturing of high temperature thermistors. Thus, Si and Ge thermistors can be produced with smaller sizes and with much higher yield than ceramic thermistors. This decreases the thermistors production costs and opens an opportunity for new applications for these high sensitive thermistors, for example, in medicine, where the small size is of great importance. An employment of two materials, Si and Ge, with intrinsic conductivity allows the production of thermistors with any resistance value from 1 Ohm up to $10^7$ Ohms that covers the whole working temperature range under consideration, and, thus, satisfies all industry needs. However, the single crystal Si and Ge employed in electronic industry contains doping impurities, and it is practically impossible to grow single crystal Si and Ge completely free of such doping impurities. Additionally, the time of life for minority charge carriers is very high in refined silicon and germanium single crystals (it is in a millisecond range). As a result, it is difficult to make ohmic contacts to such materials because they inject charge carriers or extract them even at a very low bias voltage.

The present invention enables one to produce Si and Ge NTC interchangeable thermistors in desirable temperature ranges. Certain embodiments also show how to develop crystalline Si and Ge with intrinsic conductivity and ohmic contacts for a large electrical field. To do this, it is necessary to use polycrystalline Si and Ge with certain properties. For Si NTC thermistors it is necessary to choose polycrystalline Si, which is employed as a raw material for float zone single crystal silicon production. The diameter of polycrystalline Si rods should be more than 20 mm. Such ingot size allows one to remove the highly doped polycrystalline silicon seed that is located in a central part along the polycrystalline Si rod, and an area around the seed. The area around the seed has a radius of 0.5-2.5 cm, and contains an increased impurity concentration due to diffusion from the doped seed during high temperature growth of polysilicon. Deep donor-acceptor centers created by structure defects (grain boundaries) will compensate electrons and/or holes from existing impurity in polycrystalline Si and create an intrinsic conductivity in the semiconductor material. Thus, part of the polycrystalline Si ingot with a removed central core can be employed for Si thermistor production.

A large concentration of structure defects in grain boundaries of polycrystalline Si (dislocations, vacancies, etc.) provides a sharp decrease of minority charge carries time of life in the thermistor "body." This eases a problem of the development of high quality ohmic contacts to intrinsic semiconductor materials. It is necessary to choose polycrystalline Si having a room temperature concentration of electrically active impurities $/N_D-N_A/$ that does not exceed $5\times10^{12}$ $cm^{-3}$ (after removing the central seed and an area around it). Such impurity concentration can be compensated in full by thermostable structure defects of grain boundaries, which generate deep energy levels (donor-acceptor centers) in the middle of the Si band gap. The value of intrinsic charge carrier concentration, generated by the temperature in such polycrystalline Si, will be an order of magnitude larger than the concentration of charge carriers activated from deep levels in the middle of the band gap. Thus, intrinsic conductivity will define a temperature dependence of semiconductor resistivity and that will provide interchangeability for Si thermistors.

After removing the central part of an Si polycrystalline ingot, the ingot should be sliced to obtain wafers. As it was experimentally discovered, the thickness of employed polycrystalline wafers should not be less than 100 micron in order to provide an electrical field for polysilicon thermistors of less than 100 V/cm at a regular thermistors working bias voltage of about 1 V. This is because the current-voltage characteristic for polycrystalline Si thermistors is linear in an electrical field of up to 100 V/cm. Thin film ohmic metal contacts to Si are made on both roughly grinded flat surfaces of the Si rings. The use of grinded surfaces provide a large defect concentration in metal contact areas, in addition to the grain boundary defects inside of the thermistor "body", and decrease the time of life for minority charge carriers and improves ohmic properties of the contacts.

In one embodiment, ohmic contacts to polycrystalline Si with intrinsic conductivity are produced by vacuum deposition of A1 films having a thickness in the range of 1,000 Å-3,000 Å. The temperature of the Si substrate during sputtering on both sides of the Si wafer is in the range of 200-500° C. After deposition of the A1 film, a protective film of TiN with a thickness of 3,000 Å-10,000 Å is deposited by sputtering on the top of A1 film, followed by a metal film deposition (Ag, Au, Pt, Ni, etc.) with a thickness of 3,000 Å-50,000 Å. Any other method of producing an ohmic contact to an intrinsic silicon/germanium is also applicable. The wafer with the deposited metal films should be cut into appropriately sized pieces (dies), and the metal wires should be attached to the ohmic contacts. The thermistor structure may be packaged in epoxy, glass, or any other appropriate way. Si thermistors as described above with a size of $0.5\times0.5\times0.25$ $mm^3$ and larger, and with a resistance value in the range of $10^5$-$10^7$ Ohm, have been produced.

For Ge high temperature thermistor production, polycrystalline Ge with an impurity concentration of $/N_D-N_A/<10^{12}$ $cm^{-3}$ which is employed as an intermediate raw material for the production of Ge gamma detectors, has to be chosen. The ohmic contacts to the polycrystalline Ge are produced with the same technology as described above with reference to Si thermistors. Ge thermistors with intrinsic conductivity with a size of $0.3\times0.3\times1$ $mm^3$ and larger and a resistance value of about 6.7 kOhm have been produced. However, in the case of Ge thermistors, it is also possible to make both ohmic contacts on the same surface of the polycrystalline Ge using photolithography.

FIG. 1 shows a side view of a Ge thermistor, in accordance with one embodiment of the present invention. In this figure, ohmic contacts 1 to Ge wafer 2, are attached to wires 3, as shown. Because of a small value of intrinsic electrical conductivity in polycrystalline Ge (its room temperature resistivity is in a range of 50-90 Ohm·cm), thermistors with such design cover a range of resistance from 1 Ohm up to $10^6$ Ohm. For this purpose, a Ge wafer should have a thickness of 5-10 microns. In one embodiment, a thick Ge wafer can be glued to a thick dielectric substrate and polished down to desirable thickness. Such designs are extremely beneficial because they allow almost any resistance value by only changing the thermistor length and width at the same thickness of Ge wafer. For polycrystalline Si with an intrinsic resistivity value at 25° C. of about $2.5\times10^5$ Ohm·cm and more, this thermistor design is impractical because of a very high resistance value for such thermistors ($10^8$-$10^{10}$ Ohm).

Both polycrystalline Si and Ge thermistors are operated in electrical fields not more than about 100V/cm. It was experimentally discovered that in higher electrical fields the voltage-current characteristic V(I) of produced thermistors is non-linear, which makes their operation impossible.

Proposed thermistor designs with both ohmic contacts on the same surface can also be applied to PTC (positive temperature coefficient) thermistors, which can be produced by standard technology from single crystal Si. The new design allows production of PTC thermistors with almost any resistance, even when a low resistivity thin silicon wafer is employed in order to increase the working temperature range for PTC silicon thermistors. For example, PTC silicon thermistors can be produced from low-resistivity p-Si connected by standard bonding technology to another silicon substrate (Unibond technology for SOI (silicon-on-insulator) IC production).

Figure 2:
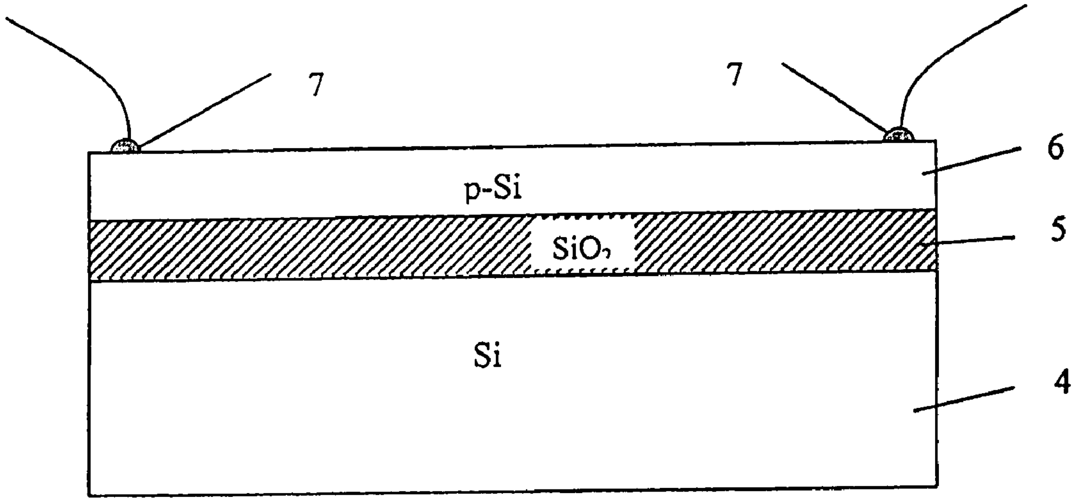
FIG. 2 shows a side view of a p-Si PTC thermistor.

FIG. 2 shows a side view of a p-Si PTC thermistor. In this figure, Si 4 is used as a substrate with a thin layer of dielectric silicon oxide, $SiO_2$ 5. To produce a PTC thermistor, highly doped p-Si 6 with ohmic contacts 7 is employed. The thickness of the employed high doped silicon can be reproducibly decreased by mechanical and/or chemical etching methods down to about 0.5 micron. This allows one to reach a resistance value for Si PTC of up to $10^5$ Ohm at a Si resistivity value of about 1 Ohm cm, and, consequently, to increase the highest working temperature up to 400° C.

An application of neutron transmutation doped n-type silicon (NTD) with a resistivity value in the range of 1-30 Ohm cm and resistivity non-uniformity of less than 3% can also be employed for such "one side contact design" with SOI technology. Such neutron transmutation doped n-type silicon can be used in order to produce highly interchangeable PTC thermistors with an extended working temperature range of up to 350-400° C.

Figure 3:
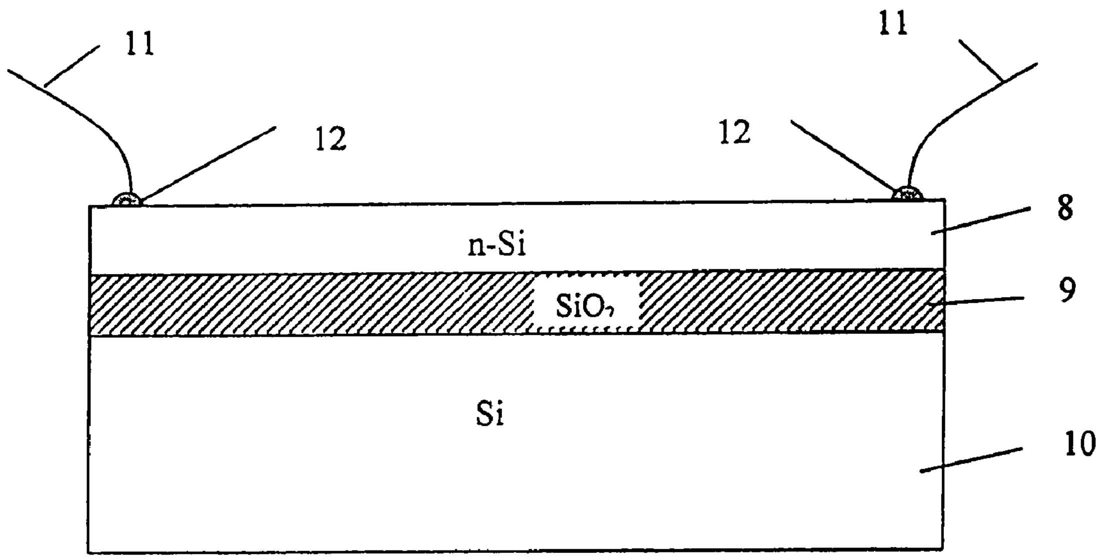
FIG. 3 illustrates a side view of a n-Si PTC thermistor.

FIG. 3 illustrates a side view of a n-Si PTC thermistor, in accordance with one embodiment of the present invention. In the FIG. 3, neutron doped silicon 8 is positioned above a dielectric silicon oxide layer 9, produced by SOI bonding technology. These layers are positioned over a silicon substrate 10. The neutron doped silicon 8 has ohmic contacts 12 and is connected to wires 11.

Thus, development of a novel technology for high temperature semiconductor thermistors based upon polycrystalline Si and Ge allows production in large volume of inexpensive interchangeable NTC thermistors with the highest thermosensitivity (7.3%/degree for Si and 5.3%/degree for Ge at 25° C.) for a temperature range of −50 to +500° C.

The foregoing description of specific embodiments of the present invention have been presented for purposes of illustration and description. They are not intended to be exhaustive nor to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. Therefore, it is intended that the scope of the invention be defined by the claims appended thereto and their equivalents, rather than by the foregoing description. All changes which come within the meaning and range of equivalency of the claims are to be embraced within their scope.

What is claimed is:

1. A method of manufacturing a high temperature NTC thermistor comprising:

cutting a portion of an ingot that is substantially free from free charge carriers introduced by doping impurities, wherein the ingot is any one of Si or Ge;

cutting a wafer from the cut portion of the ingot that is substantially free from said free charge carriers introduced by doping impurities to form an NTC thermistor body;

forming at least one ohmic contact on at least one surface of the wafer by heating the wafer to about 200-500 degrees C. and forming a metal film on at least one surface of the heated wafer; and dicing the wafer to form at least one high temperature NTC thermistor.

2. A method of manufacturing a high temperature NTC thermistor comprising:

forming a polycrystalline thermistor body from a material selected from a list consisting of polycrystalline Si with intrinsic conductivity and polycrystalline Ge with intrinsic conductivity, wherein forming the polycrystalline thermistor body comprises:

selecting an ingot from a list consisting of polycrystalline Si with intrinsic conductivity and polycrystalline Ge with intrinsic conductivity;

cutting a portion of the ingot that is substantially free from impurities;

slicing a wafer from the cut portion of the ingot; and dicing the wafer; and forming at least one ohmic contact on at least one surface of the polycrystalline thermistor body.

3. The method of claim 2, wherein:

cutting a portion of the ingot that is substantially free from impurities comprises removing a central part of the ingot and removing an outer surface of the ingot.

4. The method of claim 2, wherein forming at least one ohmic contact on at least one surface of the polycrystalline thermistor body comprises:

heating the wafer to about 200-500 degrees C.; and forming a metal film on at least one surface of the heated wafer.

5. The method of claim 4, further comprising:

forming a protective film over the metal film.

6. The method of claim 2, further comprising:

grinding at least one surface of the wafer before forming the at least one ohmic contact.

7. A method of manufacturing a high temperature thermistor comprising:

forming at least one ohmic contact on at least one surface of a wafer, wherein the wafer is selected from a list consisting of single crystal Si and polycrystalline Ge with intrinsic conductivity;

bonding the wafer to an insulator; and dicing the wafer and insulator to form a plurality of high temperature thermistors.

8. The method of claim 7, wherein forming at least one ohmic contact on at least one surface of the wafer comprises forming two ohmic contacts on a single surface of the wafer.

9. The method of claim 7, wherein the single crystal Si is doped with at least one of an n-type dopant and a p-type dopant.

10. The method of claim 7, wherein:

the insulator comprises a silicon substrate with a layer of silicon oxide.

11. The method of claim 7, wherein forming at least one ohmic contact on at least one surface of the wafer comprises:

heating the wafer to about 200-500 degrees C.; and forming a metal film on at least one surface of the wafer.

12. The method of claim 7, further comprising:

Reducing the thickness of the wafer before forming the at least one ohmic contact.

13. The method of claim 7, further comprising:

grinding at least one surface of the wafer before forming the at least one ohmic contact.

* * * * *